United States Patent

Sumi et al.

[11] Patent Number: 5,940,699
[45] Date of Patent: Aug. 17, 1999

[54] PROCESS OF FABRICATING SEMICONDUCTOR DEVICE

[75] Inventors: Hirofumi Sumi; Jun Suenaga; Kazuhiro Tajima, all of Kanagawa; Yutaka Okamoto, Tokyo; Atsushi Horiuchi, Kanagawa, all of Japan

[73] Assignee: Sony Corporation, Tokyo, Japan

[21] Appl. No.: 08/805,136

[22] Filed: Feb. 24, 1997

[30] Foreign Application Priority Data

Feb. 26, 1996 [JP] Japan ..................... 8-037690

[51] Int. Cl.⁶ .................................... H01L 21/8238
[52] U.S. Cl. .................... 438/233; 438/139; 438/282; 438/300; 438/305; 438/453
[58] Field of Search ..................... 438/139, 232, 438/233, 282, 300, 303, 304, 305, 453

[56] References Cited

U.S. PATENT DOCUMENTS

| | | | |
|---|---|---|---|
| 5,017,508 | 5/1991 | Dodt et al. | 438/139 |
| 5,168,072 | 12/1992 | Moslehi | 438/300 |
| 5,420,079 | 5/1995 | Onishi et al. | 438/303 |
| 5,541,131 | 7/1996 | Yoo et al. | 438/305 |
| 5,605,854 | 2/1997 | Yoo | 438/305 |
| 5,668,024 | 9/1997 | Tsai et al. | 438/199 |

*Primary Examiner*—Peter Toby Brown
*Assistant Examiner*—Khanh Duong
*Attorney, Agent, or Firm*—Hill & Simpson

[57] ABSTRACT

A process of fabricating a semiconductor device, includes the steps of: forming a side wall insulating film on a side portion of a gate electrode formed on a silicon substrate; forming a source/drain region in the silicon substrate, and subjecting the source/drain region to an activating heat treatment; forming a metal film on the surface of the source/drain region, and making the metal film react with the silicon substrate by a heat treatment thereby forming a silicide layer; wherein a first furnace heat treatment is performed after formation of the side wall insulating film and before formation the source/drain region; and an oxide film formed on the surface of the silicon substrate is removed before formation of the metal film, a surface side of the silicon substrate is made amorphous by doping ions of arsenic into the silicon substrate, and the metal film is formed.

9 Claims, 10 Drawing Sheets

FURNACE HEAT TREATMENT +
ACTIVATING HEAT TREATMENT

FURNACE HEAT TREATMENT

F I G. 7
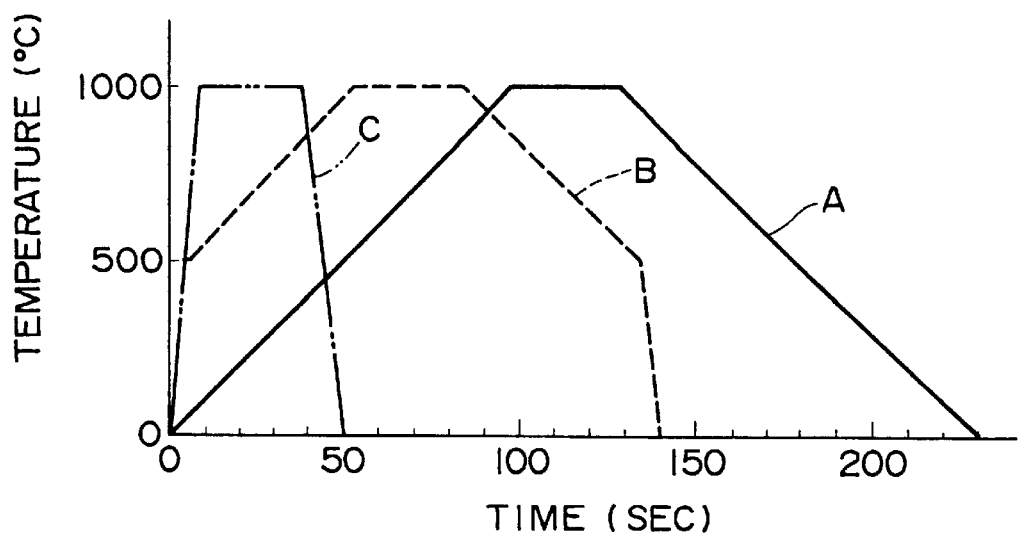
F I G. 9
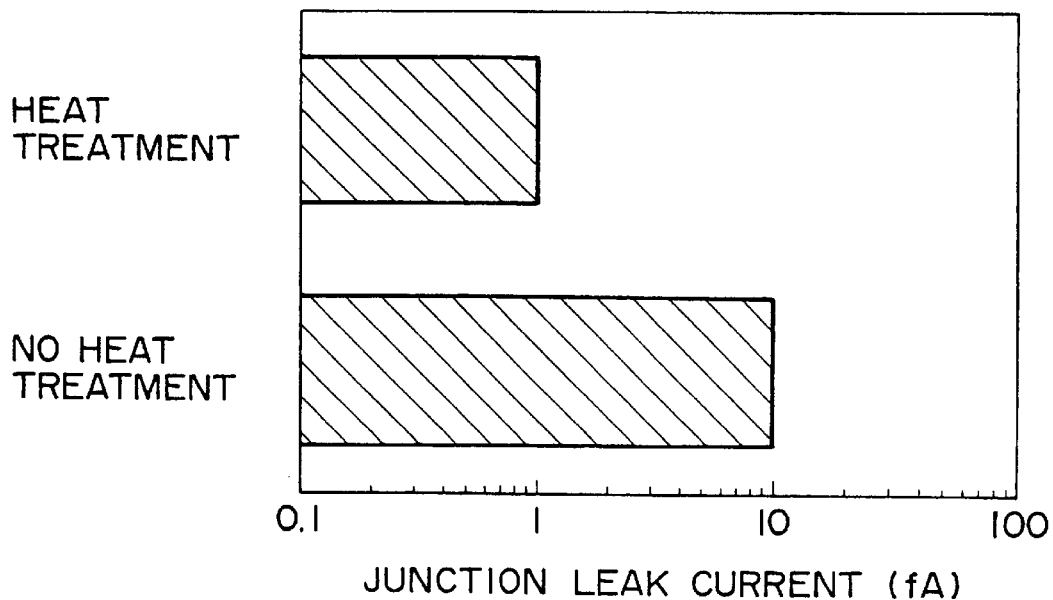

FIG. 8A SHEET RESISTANCE OF P-TYPE SOURCE/DRAIN REGION
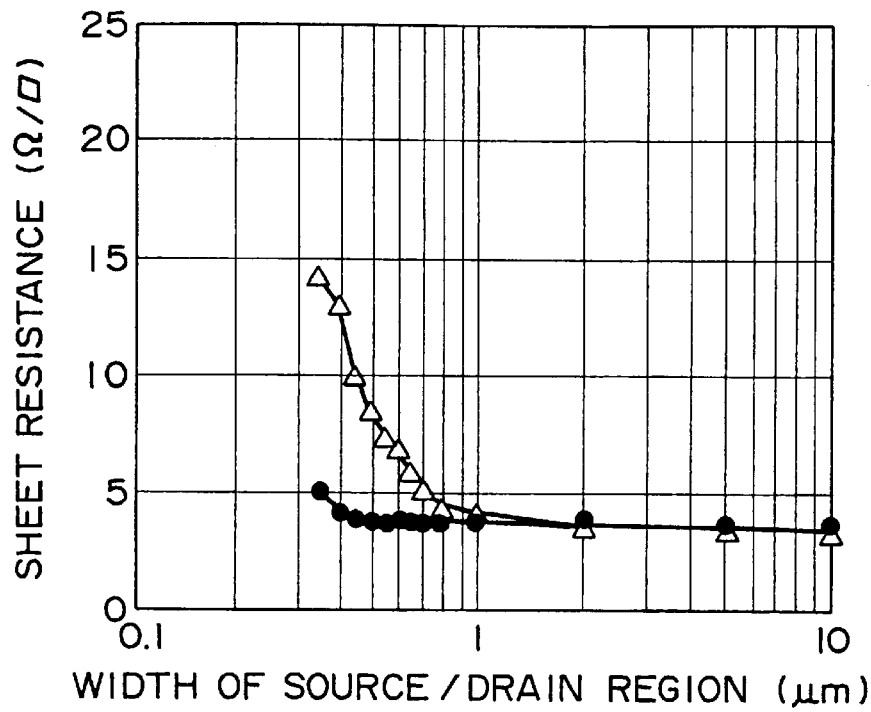
FIG. 8B SHEET RESISTANCE OF N-TYPE SOURCE/DRAIN REGION
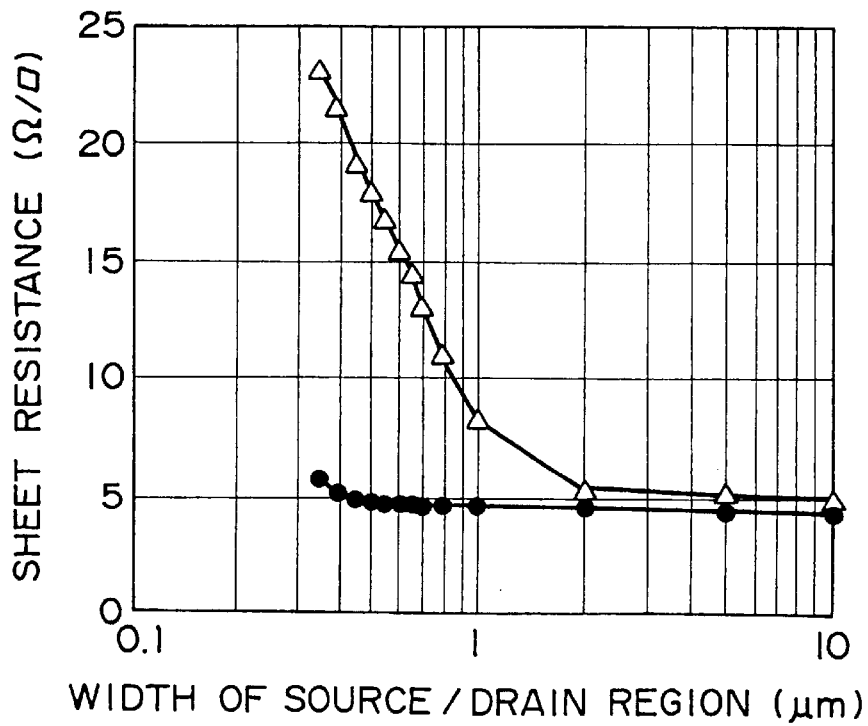

PROCESS OF FABRICATING SEMICONDUCTOR DEVICE

BACKGROUND OF THE INVENTION

The present invention relates to a process of fabricating a semiconductor device including a step of forming a silicide layer.

In the transistor field, it has been increasingly required to make shallower diffusion layers with a thrust toward finer-line geometries of devices. More specifically, because of a tendency to reduce gate line widths, a short-channel effect increases unless a diffusion layer is made considerably shallow in depth. For example, in the case of a transistor having a gate line width of 0.25 $\mu$m, the depth of a diffusion layer is required to be as shallow as about 0.08 $\mu$m.

With such a tendency to make shallower a diffusion layer, a sheet resistance in a source/drain region of a transistor is increased, with a problem that a response speed of the device is degraded. Now, letting $\pi$pd be a gate delay time, an operational frequency "f" is related to 1/$\pi$pd, and accordingly, if the response speed is degraded, the operational frequency cannot be expected to be improved. This situation is particularly inconvenient for a microprocessor unit (MPU) requiring a high speed operation. To cope with such an inconvenience, there has been proposed a process for selectively forming a titanium silicide (TiSi$_2$) having a low resistance only on a source/drain region.

Here, one example of a related art MOS (Metal-Oxide-Semiconductor) LSI fabrication process will be described with reference to a sequence of fabrication steps shown in FIGS. 10A to 10C.

A MOS transistor is formed by a known process shown in FIG. 10A. Element isolation regions 112 are formed in a semiconducting substrate 111, followed by formation of a gate insulating film 113 on the semiconducting substrate 111, and a gate interconnection 114 is formed on the gate insulating film 113. LDD (Lightly doped Drain) regions 115, 116 are formed in the semiconducting substrate 111 on both sides of the gate interconnection 114, and side wall insulating films 117, 118 are formed on side walls of the gate interconnection 114. Subsequently, ions of a conducting type impurity are doped in the semiconducting substrate 111 by ion implantation, followed by RTA (Rapid Thermal Annealing) as activating heat treatment, to form source/drain regions 119, 120 in the semiconducting substrate 111 on both the sides of the gate interconnection 114. In this activating heat treatment, heating is performed at a temperature rising rate of about 100° C./sec and cooling is performed at a temperature dropping rate of about 100° C./sec. A MOS transistor 101 is thus formed.

As shown in FIG. 10B, a natural oxide film (not shown) on the source/drain regions 119, 120 are perfectly removed by subjecting the semiconducting substrate 111 to hydrofluoric acid (HF) treatment, and a titanium (Ti) film is formed over the entire surface to a thickness of 50 nm by, for example, sputtering. After that, the semiconducting substrate 111 in such a state is subjected to heat treatment in two stages (first heat treatment: 500° C. in a nitrogen atmosphere, second heat treatment: 800° C. in a nitrogen atmosphere), to selectively form low resistance titanium silicide (TiSi$_2$) layers 121, 122, 123 by reaction of silicon contained in the source/drain regions 119, 120 and the gate interconnection 114 with titanium (Ti) contained in the titanium film.

The semiconducting substrate 111 is immersed, for example, in a solution of ammonia and hydrogen peroxide to selectively etch a non-reactant portion (not shown) of the titanium film.

As shown in FIG. 10C, an interlayer insulating film 131 made of silicon oxide is formed on the semiconducting substrate 111 so as to cover the MOS transistor 101 by, for example, CVD (Chemical vapor Deposition). A contact hole 132 is formed in the interlayer insulating film 131 on, for example, the source/drain region 120 by lithography and etching, and a tungsten plug 134 is formed in the contact hole 132 via an adhesive layer 133 by a known blanket tungsten plug process. Then, an adhesive layer 141 and an interconnection layer 142 formed of an aluminum alloy (for example, aluminum-silicon) film are formed on the interlayer insulating film 131 in a state being connected to the tungsten plug 134. Finally, the adhesive layer 141 and the interconnection layer 142 are patterned by lithography and etching, to form an interconnection 143.

The device formed in accordance with the above-described process has an advantage that a resistance of each of the source/drain regions 119, 120 can be reduced by about one digit as compared with a conventional structure having no titanium silicide.

The above-described process, however, has a problem. Namely, in recent years, it is increasingly required to make diffusion layers finer with the thrust toward finer-line geometries of devices, as a result of which a titanium silicide must be formed in a narrow source/drain region, tending to be aggregated, thus making it impossible to reduce the sheet resistance. In particular, it becomes difficult to reduce the sheet resistance for a diffusion region having a width of 0.5 $\mu$m or less.

Hereinafter, the mechanism in which titanium silicide is aggregated will be described.

Titanium silicide has two crystal phases: one containing high resistance C49 type crystals, and the other containing low resistance C54 type crystals. In general, titanium silicide having the above two crystal phases is formed by heat treatment in two stages.

A first stage heat treatment is performed at a relatively low temperature at which titanium (Ti) does not react with an insulating film but reacts with silicon (Si), to form titanium silicide having the C49 type crystal phase.

The non-reactant titanium is removed.

Then, a second stage heat treatment is performed at a relatively high temperature, to convert the titanium silicide from the C49 type crystal phase to the C54 type crystal phase having a low resistance.

In a fine width region (for example, a region having a width less than 0.5 $\mu$m), however, the C49 type crystal phase is not converted into the C54 type crystal phase, and consequently, in the second stage heat treatment, the C49 type crystals having a high resistance are aggregated.

Additionally, with a tendency to make shallower a diffusion layer, it is necessary to make thin a titanium silicide film formed on the diffusion layer. However, the thinning of a titanium silicide film causes aggregation of titanium silicide formed on the diffusion layer, thereby making it more difficult to reduce the sheet resistance of the diffusion layer at a narrow portion.

To prevent the aggregation of titanium silicide, there may be considered a process of implanting ions of arsenic in a region of a semiconducting substrate on which silicide is to be formed, thereby making the region amorphous.

In this process, however, since the radius of an arsenic ion is large, oxygen in a natural oxide film formed on the surface of the silicon substrate is knocked-on into the silicon substrate by ions of arsenic, to thereby cause aggregation of silicide upon silicide formation.

The related art process including the step of forming a silicide layer also has the following important problem. Namely, as shown in FIG. 11, stress concentration regions S are produced in the silicon substrate 111 at the ends of the side wall insulating film 117 (118) and the ends of the element isolation region 112 after formation of the titanium silicide layer 121 (122). In this region S, crystal dislocations or the like are generated. Moreover, crystal defects F are produced by ion implantation, and they cannot be sufficiently recovered only by RTA as the activating heat treatment, leading to generation of leak current.

More specifically, in the activating heat treatment for the source/drain region 119 (120), the temperature rising rate is as high as 100° C./sec and the temperature dropping rate is as high as 100° C./sec, so that the crystal defects F produced by ion implantation cannot be sufficiently recovered by the activating heat treatment.

SUMMARY OF THE INVENTION

An object of the present invention is to provide a process of fabricating a semiconductor device capable of forming a silicide layer without generation of aggregation thereof.

Another object of the present invention is to provide a process of fabricating a semiconductor device capable of relieving stresses produced in a silicon substrate at ends of a side wall insulating film and of recovering crystal defects caused by ion implantation, thereby preventing generation leak current.

To achieve the above object, according to one preferred embodiment of the present invention, there is provided a process of fabricating a semiconductor device, including the steps of forming a gate electrode on a silicon substrate via a gate insulating film and forming a side wall insulating film on the silicon substrate at a side portion of the gate electrode; forming a source/drain region in the silicon substrate and subjecting the source/drain region to activating heat treatment; forming a metal film on the surface of the source/drain region; and making the metal film react with the silicon substrate by a heat treatment thereby forming a silicide layer, wherein after formation of the side wall insulating film, the surface of the silicon substrate is oxidized, and the source/drain region is formed by ion implantation, followed by furnace heat treatment (and RTA as needed); and an oxide film formed on the surface of the silicon substrate is removed before formation of the metal film, a surface side of the silicon substrate is made amorphous by doping ions of arsenic into the silicon substrate, and the metal film for forming a silicide layer is formed.

In the above process, since after formation of the side wall insulating film, furnace heat treatment and oxidization are performed before formation of the source/drain region by ion implantation and further the activating heat treatment is performed by RTA and furnace heat treatment, it is possible to relieve stresses produced in the silicon substrate at the ends of the side wall insulating film and to recover residual defects. This is effective to eliminate junction leak current and hence to improve electric characteristics of the transistor.

Moreover, since an oxide film formed on the surface of the silicon substrate is removed before formation of the metal film, a surface side of the silicon substrate is made amorphous by doping ions of arsenic into the silicon substrate, and the metal film for forming the silicide layer is formed, it is possible to prevent knock-on of oxygen into the silicon substrate upon ion implantation of arsenic, and hence to prevent aggregation of silicide upon silicide formation.

This makes it possible to form a silicide layer even on a region having a narrow width of a sub-micron or less, and hence to reduce the resistance of the transistor with a finer structure.

In addition, RTA as the activating heat treatment for the source/drain region is insufficient to recovery crystallinity of the silicon substrate; however, the crystallinity can be recovered by the furnace heat treatment performed in such a condition as not to extend the depth of the diffusion layer.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 7 is a diagram illustrating a temperature chart of RTA;

FIGS. 8A and 8B are graphs each showing a relationship between the sheet resistance of a source drain region and the width thereof for MIS transistors fabricated by the inventive process and related art process;

FIG. 9 is a diagram illustrating a change in junction leak current depending on the presence or absence of heat treatment;

DETAILED DESCRIPTION OF THE PREFERRED EMBODIMENTS

Hereinafter, preferred embodiments of the present invention will be described with reference to the drawings.

First, a process of forming a Complementary MIS (Metal Insulator Semiconductor) transistor as a first embodiment of the present invention will be described with reference to a sequence of fabrication steps shown in FIGS. 1A to 1D and FIGS. 2A to 2C.

Figure 1A:
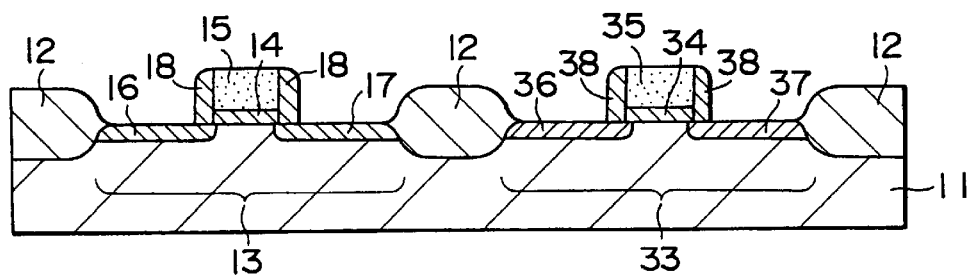
FIGS. 1A to 1D are views showing a sequence of steps of fabricating a semiconductor device according to a first embodiment of the present invention.

As shown in FIG. 1A, element isolation regions 12, a P channel transistor forming region 13 and an N channel transistor forming region 33 are formed in a semiconducting substrate 11 having at least a surface layer formed of silicon (hereinafter, referred to as a silicon (Si) substrate). In addition, each of the P channel transistor forming region 13 and the N channel transistor forming region 33 is formed of, for example, a well layer (not shown). For example, the P channel transistor forming region 13 is formed of an N-type well layer, while the N channel transistor forming region 33 is formed of a P-type well layer.

On the other hand, the element isolation region 12 is formed by a known local oxidation process, for example, LOCOS (Local Oxidation of Silicon) process, and gate insulating films 14 and 34 are respectively formed in the transistor forming regions 13, 33 by a known MOS transistor forming process. Then, a gate electrode 15 is formed on the gate insulating film 14 and a gate electrode 35 is formed on the gate insulating film 34. At the same time, gate interconnections (not shown) are formed. LDD (Lightly Doped Drain) regions 16, 17 are formed in a surface layer of the silicon substrate 11 at the P channel transistor forming region 13, and LDD regions 36, 37 are formed in a surface layer of the silicon substrate 11 at the N channel transistor forming region 33.

Subsequently, a silicon oxide (SiO$_2$) film is formed over the entire surface of the silicon substrate 11, followed by etching-back of the silicon oxide film, to form a side wall insulating film 18, used for leaving part of the LDD regions 16, 17 on the gate electrode 15 side, on a side wall of the gate electrode 15 and also to form a side wall insulating film 38, used for leaving part of the LDD regions 36, 37 on the gate electrode 35 side, on a side wall of the gate electrode 35.

The silicon substrate 11 in such a state is subjected to heat treatment, for example, a furnace heat treatment. Hereinafter, the furnace heat treatment means a heat treatment performed in a heat treatment furnace.

The heat treatment condition is as follows:

heat treatment atmosphere: nitrogen (N$_2$); flow rate=4 slm [flow rate in volume (dm$^3$/min) in standard state]

heat treatment temperature: 850° C.

heat treatment time: 30 min

Hereinafter, the heat treatment temperature means a temperature at which the substrate is kept for a specified time in order to be heat-treated, and the heat treatment time means a time for which the substrate is kept at a specified temperature in order to be heat-treated.

In addition, the heat treatment temperature may be set at a specified value in a range of from 750° C. to 900° C., and the heat treatment time may be suitably set, preferably, in a range of from 10 min to 30 min.

Figure 1B:
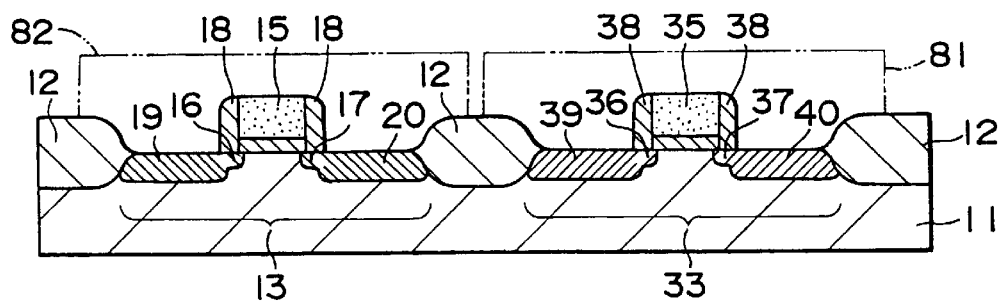

As shown in FIG. 1B, an oxide film (not shown) is formed on the silicon substrate 11 to a thickness of 10 nm by CVD.

The condition used for formation of the oxide film is as follows:

reaction gas: monosilane (SiH$_4$); flow rate=30 sccm [flow rate in volume (cm$^3$/min) in a standard state] and oxygen (O$_2$); flow rate=500 sccm film formation temperature: 400°C.

film formation time: 10 min

A resist pattern 81 (indicated by a two dot chain line) is formed so as to cover the N-channel transistor forming region 33 by lithography, and in order to form P-type source/drain regions 19, 20, ions of a P-type impurity (for example, ions of boron difluoride, BF$_2^+$) are doped in the silicon substrate 11 by ion implantation using the resist mask 81 as a mask. At this time, the element isolation regions 12, gate electrode 15, and side wall insulating film 18 also serve as a mask in the P channel transistor forming region 13. Thus, the LDD regions 16, 17 remain under the side wall insulating film 18 on both the sides of the gate electrode 15.

The condition of the ion implantation is as follows:

P type impurity: ions of boron difluoride (BF$_2^+$)

implantation energy: 40 keV dose: 3×10$^{15}$ ions/cm$^2$

The resist pattern 81 is removed and the oxide film is removed by wet etching using hydrofluoric acid.

Subsequently, a resist pattern 82 (shown by a two-dot chain line) is formed so as to cover the P channel transistor forming region 13 by lithography, and in order to form N-type source/drain regions 39, 40, ions of an N-type impurity (for example, ions of arsenic, As$^+$) are doped in the silicon substrate 11 by ion implantation using the resist pattern 82 as a mask. At this time, the element isolation regions 12, gate electrode 35, and side wall insulating film 38 also serve as a mask in the N channel transistor forming region 33. Thus, the LDD regions 36, 37 remain under the side wall insulating film 38 on both the sides of the gate electrode 35.

The condition of the ion implantation is as follows:

N-type impurity: ions of arsenic (As$^+$)

implantation energy: 50 keV dose: 3×10$^{15}$ ions/cm$^2$

In addition, after heat treatment of the silicon substrate, the ion implantation for the N channel may be in advance performed after removal of the oxide film on the source/drain regions, and the ion implantation for the P channel may be performed after formation of the oxide film.

The resist pattern is removed, and the activating heat treatment for source/drain regions 19, 20 and the source/drain regions 39, 40 is performed by RTA. As a result, the source/drain regions 19, 20 are formed in the silicon substrate 11 on both sides of the gate electrode 15 via the LDD regions 16, 17, respectively; while the source/drain regions 39, 40 are formed in the silicon substrate 11 on both the sides of the gate electrode 35 via the LDD regions 36, 37, respectively.

The condition of the activating heat treatment is as follows:

heat treatment atmosphere: nitrogen atmosphere heat treatment temperature: 1000° C.

heat treatment time: 10 sec

Figure 1C:
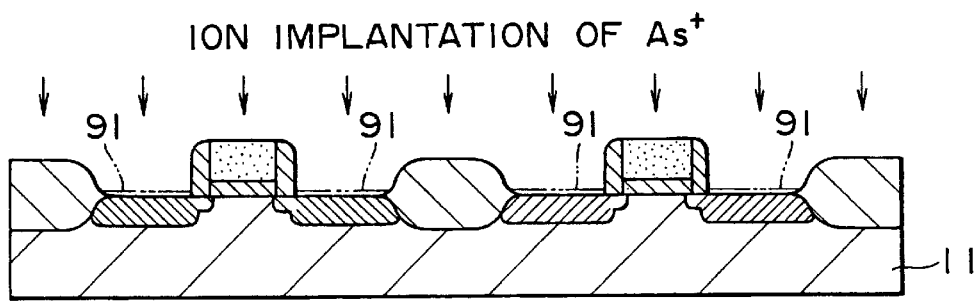

After that, as shown in FIG. 1C, a natural oxide film 91 (shown by a two-dotted line) formed on the surface of the silicon substrate 11 is removed again by wet etching using a buffer hydrofluoric acid solution.

Ions of arsenic (As$^+$) are then doped in the entire surface of the silicon substrate 11 by ion implantation.

The condition of the ion implantation is as follows:

ion implanting energy: 40 keV dose: 3×10$^{14}$ ions/cm$^2$

Figure 1D:
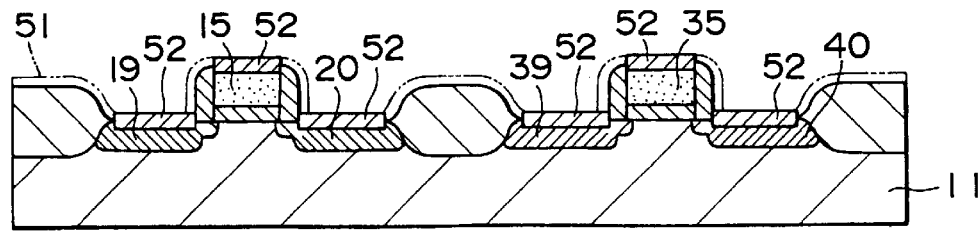

As shown in FIG. 1D, a titanium (Ti) film 51 as a metal film is formed over the entire surface of the silicon substrate 11 to a thickness of 30 nm by sputtering.

The condition of the sputtering is as follows:

sputtering gas: argon (Ar); flow rate=100 sccm sputtering power: 1 kW film formation temperature: 150° C.

pressure in film formation atmosphere: 0.47 Pa

After that, the silicon substrate 11 in such a state is subjected to heat treatment in two stages. A first stage heat treatment is performed for making titanium (Ti) contained in the titanium film 51 react with silicon (Si) contained in the silicon substrate 11, whereby forming a titanium silicide film (TiSi$_2$) film 52. At this time, in the case where each of the gate electrodes 15, 35 is formed of polysilicon, the titanium silicide layer 52 is formed on the gate electrodes 15, 35 as shown in FIG. 1D.

The condition of the first stage heat treatment is as follows:

heat treatment atmosphere: nitrogen; flow rate=5 slm heat treatment temperature: 650° C.

heat treatment time: 30 sec

A non-reactant titanium film 51 (shown by a two dot line) is selectively removed by wet etching using a solution of ammonia and hydrogen peroxide ($NH_4OH+H_2O_2$), to selectively form the titanium silicide layer 52 on the source/drain regions 19, 20, gate electrode 15, source/drain regions 39, 40, and gate electrode 35.

After that, the titanium silicide layer 52 is stabilized by a second stage heat treatment.

The condition of the second stage heat treatment is as follows:

heat treatment atmosphere: nitrogen; flow rate=5 slm heat treatment temperature: 800° C.

heat treatment time: 30 sec

Figure 2A:
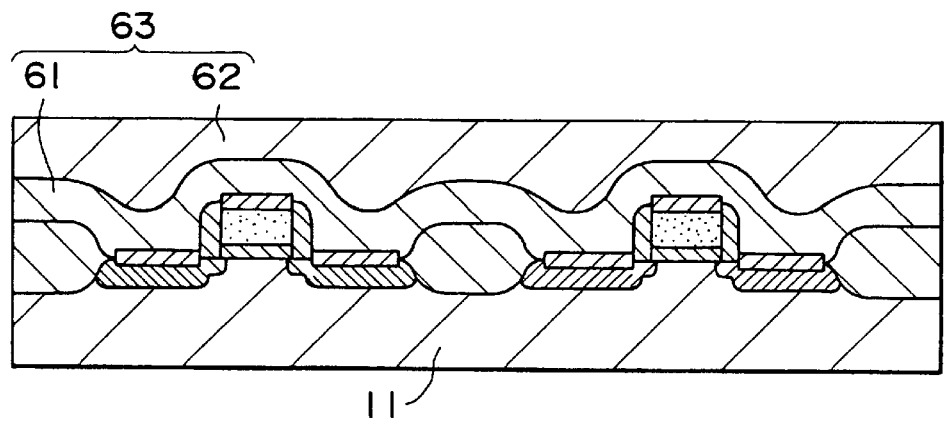
FIGS. 2A to 2C are views showing a sequence of steps of forming interconnections, which are subsequent to the fabrication steps shown in FIGS. 1A to 1D.

As shown in FIG. 2A, a silicon oxide ($SiO_2$) film 61 is formed by CVD over the entire surface of the silicon substrate 11 to a thickness of 100 nm using a silane based gas having less hydrogen-oxygen (H-0) groups.

The condition of the film formation is as follows:

reaction gas: monosilane ($SiH_4$); flow rate=30 sccm and oxygen ($O_2$); flow rate=540 sccm film formation temperature: 400° C.

pressure in film formation atmosphere: 10.2 Pa

A silicon nitrogen ($Si_3N_4$) film may be formed by low pressure CVD to a thickness of 50 nm in place of the silicon oxide film 61. The condition of this film formation is as follows:

reaction gas: diclorosilane ($SiH_2Cl_2$); flow rate=50 sccm, ammonia ($NH_3$); flow rate=200 sccm, and nitrogen ($N_2$); flow rate=200 sccm film formation temperature: 760° C.

pressure in film formation atmosphere: 70 Pa

A borophosphosilicate glass (BPSG) film 62 is formed on the oxide film 61 to a thickness of 500 nm by CVD using TEOS (Tetra-Ethyl-Ortho-Silicate).

The condition of the film formation is as follows:

reaction gas: TEOS; flow rate=50 sccm film formation temperature: 720° C.

pressure in film formation atmosphere: 40 Pa

In this way, an interlayer insulating film 63 composed of the silicon oxide film 61 and the borophososilicate glass film 62 is formed.

Figure 2B:
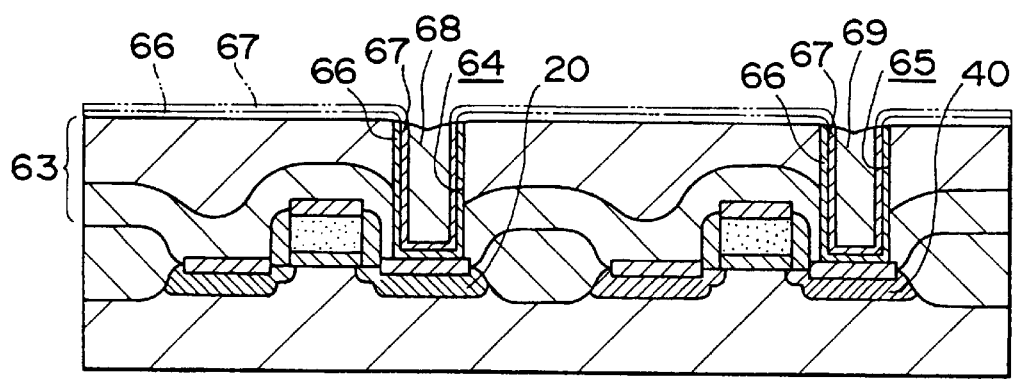

As shown in FIG. 2B, a mask for forming contact holes is formed of a resist by lithography, and contact holes 64, 65 are formed in the interlayer insulating film 63 by etching. Here, the contact hole 64 is formed at the source/drain region 20, and the contact hole 65 is formed at the source/drain region 40.

The etching condition is as follows:

etching gas: octafluorocyclobutane ($c-C_4H_8$); flow rate=50 sccm

RF power: 1.2 keV pressure in etching atmosphere: 2 Pa

In order to compensate for mask misalignment in formation of the contact holes 64, 65, ion implantation is selectively performed for the P channel transistor forming region 13 and the N channel transistor forming region 33.

The condition of the ion implantation for the N channel transistor forming region 33 is as follows:

implanted ion: ion of arsenic ($As^+$)

ion implantation energy: 50 keV dose: $3\times10^{15}$ ions/cm$^2$

The condition of the ion implantat ion for the P channel transistor forming region 13 is as follows:

implanted ion: ion of boron difluoride ($BF_2^+$)

ion implantation energy: 50 keV dose: $3\times10^{15}$ ions/cm$^2$

In addition, either of the P channel transistor forming region 13 and the N channel transistor forming region 33 may be in advance subjected to ion implantation.

The silicon substrate in such a state is subjected to RTA as activating heat treatment.

The condition of RTA is as follows:

heat treatment atmosphere: nitrogen ($N_2$)

heat treatment temperature: 850° C.

heat treatment time: 30 sec

Next, a natural oxide film is removed by ICP (Inductively Coupled Plasma) soft etching before formation of an interconnection layer.

In this way, a desirable contact can be realized by so-called in-situ processing without exposure to an oxidizing atmosphere such as atmospheric air after the ICP soft etching for the contact holes 64, 65 on the titanium silicide layer 52.

A titanium (Ti) film 66 as an adhesive layer is formed on the interlayer insulating film 63 including inner walls of contact holes 64, 65 to a thickness of 10 nm, and a titanium nitride (TiN) film 67 is formed thereon to a thickness of 70 nm.

The condition used for formation of the Ti film is as follows:

sputtering power: 8 kW film formation temperature: 150° C.

sputtering gas: argon (Ar); flow rate=100 scam pressure in film formation atmosphere: 0.47 Pa The condition used for formation of TiN film is as follows:

sputtering power: 5 kW film formation temperature: 150° C.

sputtering gas: argon (Ar); flow rate=40 scam, and nitrogen ($N_2$); flow rate=20 sccm pressure in film formation atmosphere: 0.47 Pa Next, a tungsten (W) film is formed on the adhesive film to a thickness of 400 nm so as to be buried in the contact holes.

The condition used for formation of W film is as follows:

reaction gas: argon (Ar); flow rate=2.2 slm, nitrogen ($N_2$); flow rate=300 scam, hydrogen ($H_2$); flow rate=500 scam, and tungsten hexafluoride ($WF_6$); flow rate=75 scam film formation temperature: 450° C.

pressure in film formation atmosphere: 10.64 Pa

The tungsten film is etched back to leave the tungsten film in the contact holes 64, 65, thereby forming tungsten plugs 68, 69 in the contact holes 64, 65, respectively. At this time, the titanium film 66 (shown by a two dot chain line) and the silicon nitride film 67 (shown by a two dot chain line) on the interlayer insulating film are removed.

The condition of the etching back is as follows:

etching gas: sulfur hexafluoride ($SF_6$); flow rate=50 sccm

RF power: 150 W pressure in etching atmosphere: 1.33 Pa

Figure 2C:
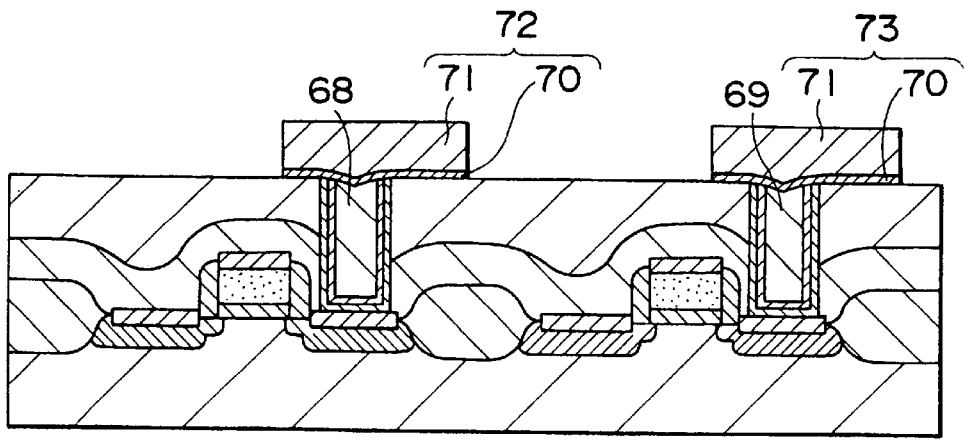

As shown in FIG. 2C, a titanium (Ti) film as an adhesive layer 70 is formed on the interlayer insulating film to a thickness of 30 nm.

The condition used for formation of the Ti film is as follows:

sputtering power: 4 kw film formation temperature: 150° C.

sputtering gas: argon (Ar); flow rate=100 sccm pressure in film formation atmosphere: 0.47 Pa Next, an aluminum (Al) film as a main interconnection layer 71 is formed on the adhesive layer 70 to a thickness of 0.5 $\mu$m by sputtering.

The condition used for formation of the Al film is as follows:

sputtering power: 22.5 kW film formation temperature: 150° C.

sputtering gas: argon (Ar); flow rate=50 sccm pressure in film formation atmosphere: 0.47 Pa Then, a resist pattern (not shown) as an etching mask for forming interconnections is formed by lithography, and the main interconnection layer 71 and the adhesive layer 70 are etched using the resist pattern as a mask, to form an interconnection 72 connected to the tungsten plug 68 and an interconnection 73 connected to the tungsten plug 69.

The etching condition is as follows:

etching gas: boron trichloride ($BCl_3$); flow rate=60 sccm, and chlorine (Cl); flow rate=90 sccm microwave power: 1 kW RF power: 50 w pressure in etching atmosphere: 16 mPa In the above process according to the first embodiment, the furnace heat treatment is performed after formation of the side wall insulating films 18, 39 and before formation of the source/drain regions 19, 20, 39, 40, and accordingly it is possible to relieve stresses produced in the silicon substrate 11 at the ends of the side wall insulating films 18, 38 to a value less than the order of 1 GPa.

Moreover, in the process according to the first embodiment, the natural oxide film 91 formed on the surface of the silicon substrate 11 is removed before formation of the titanium film 51 as the metal film for forming the titanium silicide layer 52, and thereafter, ions of arsenic are implanted in the silicon substrate 11 before formation of the titanium film 51 for forming the titanium silicide layer 52. As a result, the region of the silicon substrate 11, on which silicide is to be formed, is made amorphous by ion implant at ion of arsenic, and further since the oxide film is removed from the silicon substrate 11 before ion implantation of arsenic, oxygen contained in the oxide film can be prevented from being knocked-on into the silicon substrate 11 upon ion implantation of arsenic.

In this way, the process of forming the titanium silicide layer 52 basically includes the step of performing ESPAD (Enhanced Silicidation by Pre-Amorphous with Direct Ion Implantation), that is, implanting ions of arsenic (As) in a low concentration into the silicon substrate 11 in a state that the oxide film (natural oxide film in the first embodiment) is removed from the surface of the silicon substrate 11, thereby making amorphous the surface of the silicon substrate 11. In addition, the dose of arsenic upon the above ion implantation may be set in a range of from $1\times10^{14}$ ions/$cm^2$ to $1\times10^{16}$ ions/$cm^2$, preferably, at about $3\times10^{14}$ ions/$cm^2$.

If the ion implantation of arsenic is performed in a state that the oxide film remains on the surface of the silicon substrate 11, much of oxygen is implanted in the silicon substrate 11 by the knock-on effect, which exerts adverse effect on the subsequent titanium silicide formation, tending to cause aggregation of titanium silicide in finer portions (the source/drain regions 19, 20, 39, 40).

Accordingly, the removal of the oxide film (natural oxide film in the first embodiment) before ion implantation of arsenic is important to prevent aggregation of titanium silicide upon silicide formation.

In summary, according to the process described in the first embodiment, it is possible to prevent aggregation of titanium silicide upon silicide formation.

Figure 3A:
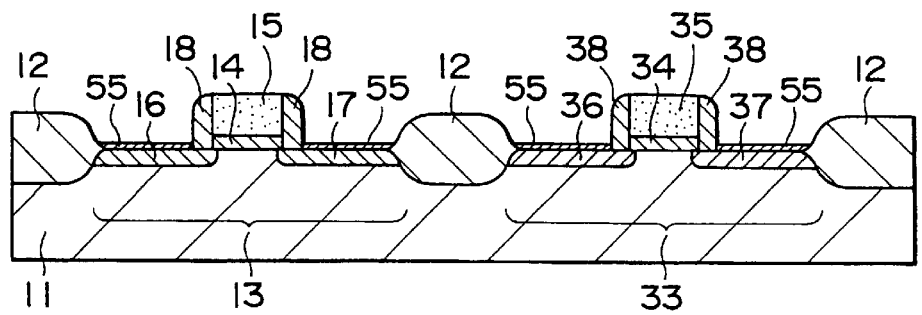
FIGS. 3A to 3C are views showing a sequence of steps of fabricating a semiconductor device according to a second embodiment of the present invention.

Next, a second embodiment of the present invention will be described with reference to a sequence of fabrication steps shown in FIGS. 3A to 3C, wherein parts corresponding to those shown in FIGS. 1A to 1D are indicated by the same characters.

In accordance with the same process as described with reference to FIG. 1A, element isolation regions 12 for isolating a P channel transistor forming region 13 from an N channel transistor forming region 33 are formed in a silicon substrate 11 (see FIG. 3A), and gate insulating films 14, 34 and gate electrodes 15, 35 are formed on the transistor forming regions 13, 33, respectively. LDD regions 16, 17 are formed in a surface layer of the silicon substrate 11 at the P channel transistor forming region 13, and LDD regions 36, 37 are formed in a surface layer of the silicon substrate 11 at the N channel transistor forming region 33. A side wall insulating film 18 is formed on a side wall of the gate electrode 15 and a side wall insulating film 38 is formed on a side wall of the gate electrode 35.

After that, an oxide film 55 is formed on the exposed surface of the silicon substrate 11 by thermal oxidation.

The condition used for formation of the oxide film 55 is as follows:

oxidizing gas: oxygen; flow rate=4 slm oxidizing temperature: 850° C.

oxidizing time: 30 min thickness of oxide film: 10 nm

In addition, the thermal oxidation temperature may be set at a specified value of from 750° C. to 900° C., and the thermal oxidation time may be suitably set, preferably, at a value of from 10 min to 30 min.

Figure 3B:
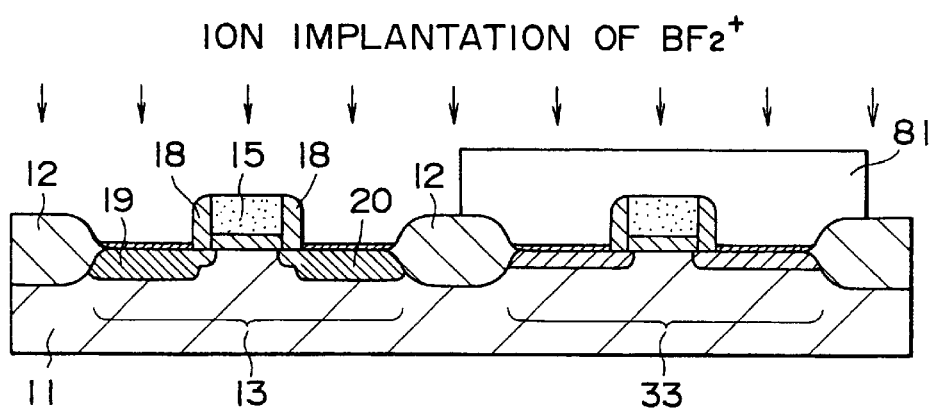

As shown in FIG. 3B, a resist pattern 81 is formed so as to cover the N channel transistor forming region 33 by lithography, and in order to form P-type source/drain regions 19, 20, ions of a P-type impurity (for example, ions of boron difluoride, $BF_2^+$) are doped in the silicon substrate 11 by ion implantation using the resist pattern 81 as a mask. At this time, the element isolation regions 12, gate electrode 15, and side wall insulating film 18 also serve as a mask in the P channel transistor forming region 13.

The condition of the ion implantation is the same as that described with reference to FIG. 1B.

The resist pattern 81 is removed and the oxide film 55 is removed by wet etching using hydrofluoric acid.

Figure 3C:
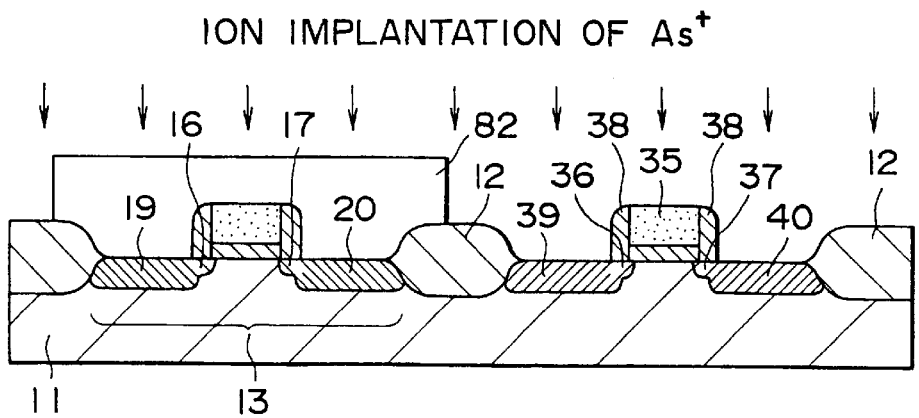

As shown in FIG. 3C, a resist pattern 82 is formed so as to cover the P channel transistor forming region 13 by lithography, and in order to form N-type source/drain regions 39, 40, ions of an N-type impurity (for example, ions of arsenic, $As^+$) are doped in the silicon substrate 11 by ion implantation using the resist pattern 82 as a mask. At this time, the element isolation regions 12, gate electrode 35, and side wall insulating film 38 also serve as a mask in the N channel transistor forming region 33.

The condition of the ion implantation is the same as that described with reference to FIG. 1B.

The resist pattern 82 is removed, followed by activating heat treatment for source/drain regions 19, 20, 39, 40.

As a result, the source/drain regions 19, 20 are formed in the silicon substrate 11 on both the sides of the gate electrode 15 via the LDD regions 16, 17, respectively, while the source/drain regions 39, 40 are formed in the silicon substrate 11 on both the sides of the gate electrode 35 via the LDD regions 36, 37, respectively.

The condition of the activating heat treatment is as follows:

heat treatment atmosphere: nitrogen atmosphere heat treatment temperature: 1000° C.

heat treatment time: 10 sec

After that, the silicon substrate 11 in such a state will be sequentially processed in accordance with the step of removing a natural oxide film (not shown) on the surface of the silicon substrate 11 and implanting ions of arsenic (As$^+$) and later steps, that is, in accordance with the steps described with reference to FIG. 1C and later figures.

In the process of the second embodiment, the oxide film 55 as a buffer film for ion implantation for forming the P-type source/drain regions 19, 20 is formed by thermal oxidation after formation of the LDD regions 16, 17 and the LDD regions 36, 37, and accordingly, it is possible to relieve stresses produced in the silicon substrate 11 at the ends of the side wall insulating films 18, 38 to a value less than the order of 1 GPa.

Figure 4A:
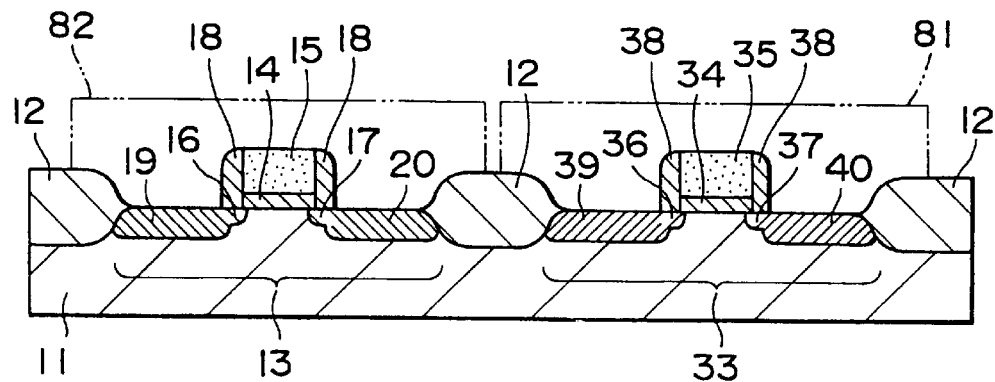
FIGS. 4A to 4B are views showing a sequence of steps of fabricating a semiconductor device according to a third embodiment of the present invention.

Next, a third embodiment of the present invention will be described with reference to a sequence of fabrication steps shown in FIGS. 4A to 4B, wherein parts corresponding to those shown in FIGS. 1A to 1D are indicated by the same characters.

In the third embodiment, after formation of source/drain regions 19, 20, 39, 40 in a silicon substrate in accordance with the process described in the first or second embodiment, the silicon substrate is subjected to furnace heat treatment. Here, there will be described a method of subjecting a silicon substrate processed in accordance with the first embodiment to furnace heat treatment.

In accordance with the process described with reference to FIG. 1A, element isolation regions 12 for isolating a P channel transistor forming region 13 from an N channel transistor forming region 33 are formed in a silicon substrate 11 (see FIG. 4A), and gate insulating films 14, 34 and gate electrodes 15, 35 are formed in the transistor forming regions 13, 33, respectively. LDD regions 16, 17 are formed in a surface layer of the silicon substrate 11 at the P channel transistor forming region 13, and LDD regions 36, 37 are formed in a surface layer of the silicon substrate 11 at the N channel transistor forming region 33. Side wall insulating films 18, 38 are formed on side walls of the gate electrodes 15, 35, respectively.

Next, the silicon substrate 11 in such a state is subjected to furnace heat treatment.

An oxide film (not shown) is then formed on the surface of the silicon substrate 11 to a thickness of 10 nm by CVD.

A resist pattern 81 (shown by a two dot chain line) is formed so as to cover the N channel transistor forming region 33, and in order to form P-type source/drain regions 19, 20, ions of a P-type impurity (for example, ions of boron difluoride, BF$_2^+$) are doped in the silicon substrate 11 by ion implantation using the resist pattern 81 as a mask.

The resist pattern 81 is removed and the oxide film (not shown) is removed by wet etching using hydrofluoric acid.

After that, a resist pattern 82 (shown by a two dot chain line) is formed so as to cover the P channel transistor forming region 13, and in order to form N-type source/drain regions 39, 40, ions of an N-type impurity (for example, ions of arsenic, As$^+$) are doped in the silicon substrate 11 by ion implantation using the resist pattern 82 as a mask.

The condition of each of the above treatments is the same as that described with reference to FIG. 1B.

In addition, after heat treatment for the silicon substrate 11, the ion implantation for the N channel may be performed in advance after removal of the oxide film on the source/drain regions, followed by ion implantation for the P channel after formation of the oxide film.

Figure 4B:
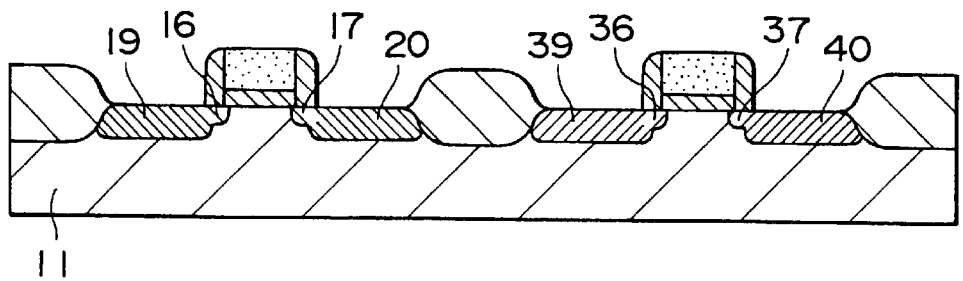

The resist pattern 82 is removed and the silicon substrate 11 is subjected to furnace heat treatment as shown in FIG. 4B.

The heat treatment condition is as follows:

heat treatment atmosphere: nitrogen (N$_2$)

heat treatment temperature: 800° C.

heat treatment time: 30 min

In addition, the heat treatment temperature may be set at a value of from 750° C. to 900° C., and the heat treatment time may be suitably set, preferably, at a value of from 10 min to 30 min.

Of course, after formation of the source/drain regions 19, 20, 39, 40 in the silicon substrate 11 in accordance with the process described in the second embodiment, the silicon substrate 11 may be subjected to the above furnace heat treatment.

Then, the source/drain regions 19, 20, 39, 40 are subjected to activating heat treatment.

As a result, the source/drain regions 19, 20 are formed in the silicon substrate 11 on both the sides of the gate electrode 15 via the LDD regions 16, 17, respectively, while the source/drain regions 39, 40 are formed in the silicon substrate 11 on both the sides of the gate electrode 35 via the LDD regions 36, 37, respectively.

The condition of the activating heat treatment is set as follows, like the condition described with reference to FIG. 1B.

heat treatment atmosphere: nitrogen atmosphere heat treatment temperature: 1000° C.

heat treatment time: 10 sec

After that, the silicon substrate 11 in such a state will be sequentially processed in accordance with the step of removing a natural oxide film (not shown) on the surface of the silicon substrate 11 and implanting ions of arsenic (As$^+$) and later steps, that is, in accordance with the steps described with reference to FIG. 1C and later figures.

In the process of the third embodiment, since the silicon substrate 11 is subjected to furnace heat treatment after formation of the source/drain regions 19, 20, 39, 40 in the silicon substrate 11 and before activating heat treatment for source/drain regions 19, 20, 39, 40, so that it is possible to relieve stresses produced in the silicon substrate 11 upon formation of the source drain regions 19, 20, 39, 40 and to recover crystal defects in the silicon substrate 11; and further to relieve stresses produced in the silicon substrate 11 upon formation of the side wall insulating films 18, 38.

Additionally, in this embodiment, before activating heat treatment for the source/drain regions formed in the silicon substrate in accordance with the first embodiment, the silicon substrate is subjected to furnace heat treatment; however, after formation of the source/drain regions 19, 20 and the source/drain regions 39, 40 in the silicon substrate 11 in accordance with the second embodiment, the silicon substrate 11 may be subjected to furnace heat treatment.

Figure 5A:
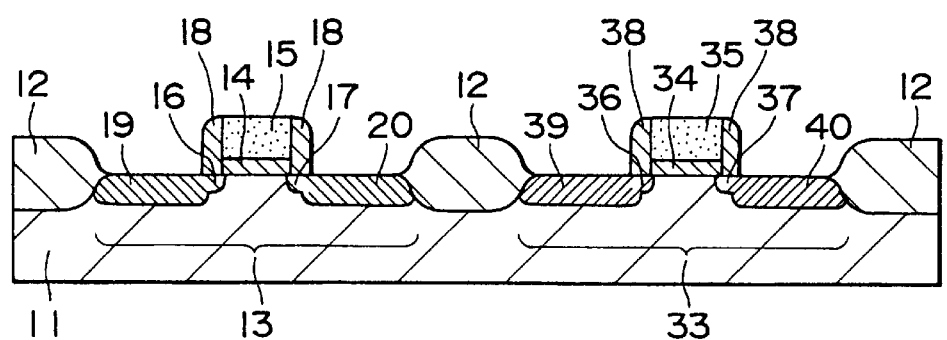
FIGS. 5A to 5B are views showing a sequence of steps of fabricating a fourth embodiment of the present invention.

Next, a fourth embodiment of the present invention will be described with reference to FIGS. 5A to 5B, wherein parts corresponding to those described with reference to FIGS. 1A to 1D are indicated by the same characters.

In this embodiment, after activating heat treatment for source/drain regions formed in a silicon substrate in accordance with the process described in each of the first, second, and third embodiments, the silicon substrate is subjected to furnace heat treatment. Here, there will be described a method in which after activating heat treatment for source/drain regions formed in a silicon substrate in accordance with the third embodiment, the silicon substrate is subjected to furnace heat treatment.

In accordance with the process described with reference to FIG. 1A, element isolation regions 12 for isolating a P channel transistor forming region 11 from an N channel transistor forming region 33 are formed in a silicon substrate 11 (see FIG. 5A), and gate insulating films 14, 34 and gate electrodes 15, 35 are formed in the transistor forming regions 13, 33, respectively. LDD regions 16, 17 are formed on a surface layer of the silicon substrate 11 at the P channel transistor forming region 13, while LDD regions 36, 37 are formed in a surface layer of the silicon substrate 11 at the N channel transistor forming region 33. Side wall insulating films 18, 38 are formed on side walls of the gate electrodes 15, 35, respectively.

The silicon substrate 11 in such a state is subjected to various treatments described in the third embodiment, which are represented by furnace heat treatment, ion implantation of a P-type impurity and an N-type impurity, furnace heat treatment, and activating heat treatment, to form source/drain regions 19, 20 in the silicon substrate 11 on both the sides of the gate electrode 15 via the LDD regions 16, 17, respectively, and to form source/drain regions 39, 40 in the silicon substrate 11 on both the sides of the gate electrode 35 via the LDD regions 36, 37, respectively.

Figure 5B:
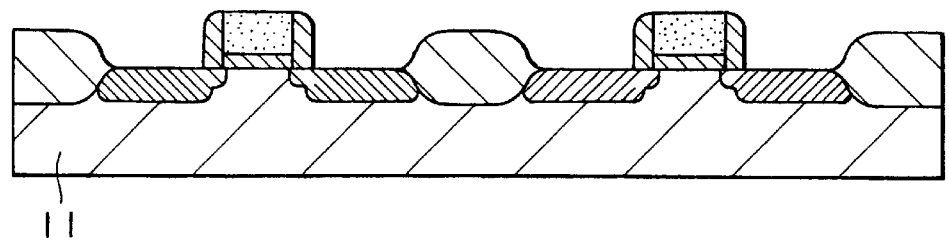

After that, as shown in FIG. 5B, furnace heat treatment is performed after the activating heat treatment.

The condition of the furnace heat treatment is as follows:
heat treatment atmosphere: nitrogen ($N_2$)
heat treatment temperature: 800° C.
heat treatment time: 30 min In this heat treatment, the heat treatment temperature may be set at a value of from 600° C. to 900° C., and the heat treatment time may be suitably set, preferably, at a value of from 10 min to 30 min. The heat treatment performed in the above condition makes it possible to recover crystal defects which are produced in the silicon substrate 11 upon ion implantation and which cannot be removed by RTA.

After that, the silicon substrate 11 in such a state will be sequentially processed in accordance with the step of removing a natural oxide film (not shown) on the surface of the silicon substrate 11 and implanting ions of arsenic ($As^+$) and later steps, that is, in accordance with the steps described with reference to FIG. 1C and later figures.

In the fourth embodiment, after formation of the source/drain regions 19, 20, 39, 40 and then activating heat treatment thereof, the silicon substrate is subjected to furnace heat treatment, and accordingly, it is possible to perfectly recover crystal defects produced in the silicon substrate 11 upon formation of the source/drain regions 19, 20, 39, 40 by ion implantation.

In this embodiment, after activating heat treatment of the source/drain regions formed in the silicon substrate in accordance with the third embodiment, the silicon substrate is subjected to furnace heat treatment; however, after activating heat treatment of source/drain regions formed in the silicon substrate in accordance with the first or second embodiment, the silicon substrate may be subjected to furnace heat treatment.

Next, a fifth embodiment of the present invention will be described with reference to FIGS. 6A to 6D, wherein parts corresponding to those described with reference to FIGS. 1A to 1D are indicated by the same characters.

The fifth embodiment is different from the first to fourth embodiments in formation of a titanium silicide layer and in heat treatment thereof. Here, steps after formation of source/drain regions will be described.

Figure 6A:
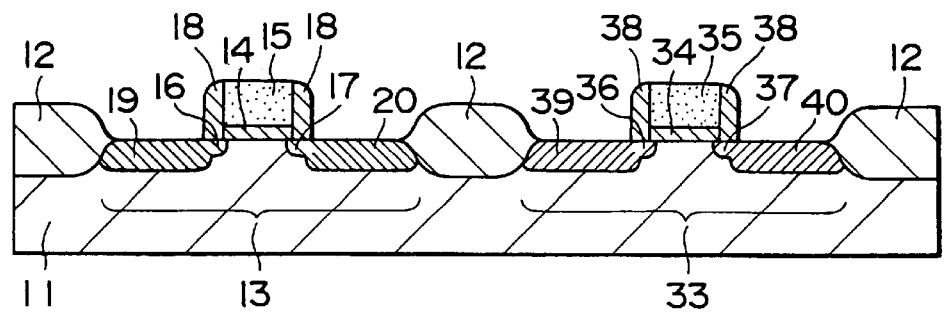
FIGS. 6A to 6D are views showing a sequence of steps of fabricating a semiconductor device according to a fifth embodiment of the present invention.

As shown in FIG. 6A, element isolation regions 12 for isolating a P channel transistor forming region 13 from an N channel transistor forming region 33 are formed in a silicon substrate 11 and gate insulating films 14, 34 and gate electrodes 15, 35 are formed in the transistor forming regions 13, 33, respectively. LDD regions 16, 17 are formed in a surface layer of the silicon substrate 11 at the P channel transistor forming region 13, while LDD regions 36, 37 are formed in a surface layer of the silicon substrate 11 at the N channel transistor forming region 33. Side wall insulating films 18, 38 are formed on side walls of the gate electrodes 15, 35, respectively.

The silicon substrate 11 in such a state is subjected to various treatments described in the first and third embodiments, which are represented by furnace heat treatment, ion implantation of a P-type impurity and an N-type impurity, furnace heat treatment, and activating heat treatment, to form source/drain regions 19, 20 in the silicon substrate 11 on both the sides of the gate electrode 15 via the LDD regions 16, 17, respectively, and to form source/drain regions 39, 40 in the silicon substrate 11 on both the sides of the gate electrode 35 via the LDD regions 36, 37, respectively.

The activating heat treatment is performed by, for example, RTA.

Figure 6B:
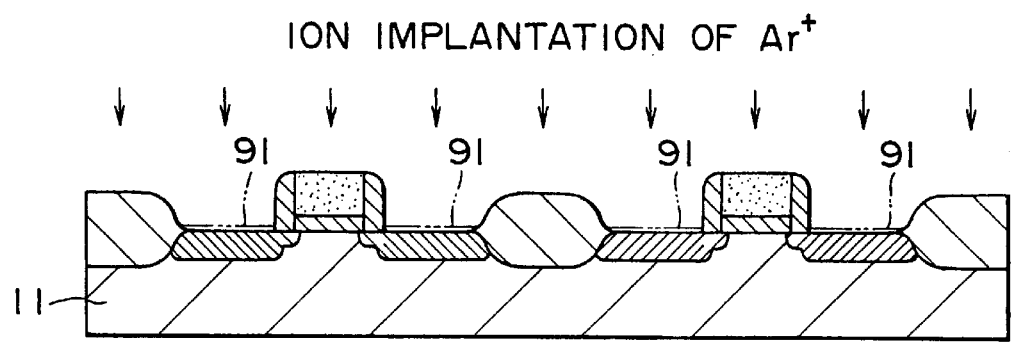

The condition of RTA is as follows:
heat treatment atmosphere: nitrogen atmosphere
heat treatment temperature: 1000° C.
heat treatment time: 10 sec After that, as shown in FIG. 6B, a natural oxide film 91 (shown by a two-dotted line) formed on the surface of the silicon substrate 11 is removed again by wet etching using a buffer hydrofluoric acid solution.

Ions of arsenic ($As^+$) are then doped in the entire surface of the silicon substrate 11 by ion implantation.

Figure 6C:
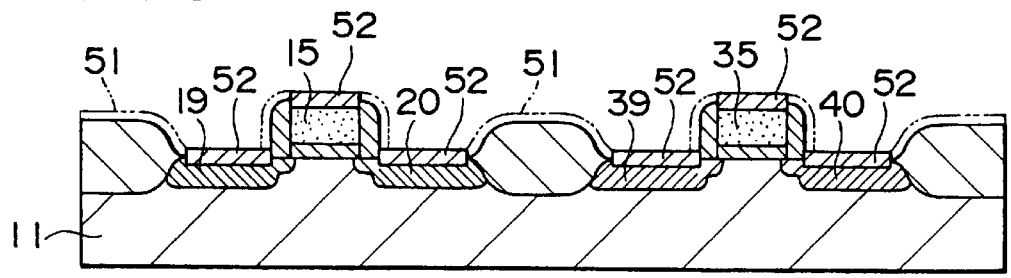

The condition of the ion implantation is as follows:
ion implanting energy: 40 kev
dose: $3 \times 10^{14}$ ions/cm$^2$ As shown in FIG. 6C, a natural oxide film (not shown) is removed by wet etching using a buffer hydrofluoric acid solution.

Then, a titanium (Ti) film 51 as a metal film is formed over the entire surface of the silicon substrate 11 to a thickness of 30 nm by sputtering.

The condition of the sputtering is as follows:
sputtering gas: argon (Ar); flow rate=100 sccm
sputtering power: 1 kW
film formation temperature: 150° C.
pressure in film formation atmosphere: 0.47 Pa After that, the silicon substrate 11 is subjected to heat treatment in two stages. A first stage heat treatment is performed by RTA for making titanium (Ti) contained in the titanium film 51 react with silicon (Si) contained in the silicon substrate 11, whereby forming a titanium silicide ($TiSi_2$) film 52. At this time, in the case where each of the gate electrodes 15, 35 is formed of polysilicon, the titanium silicide layer 52 is also formed on the gate electrodes 15, 35.

The condition of the first stage heat treatment is as follows:

heat treatment atmosphere: nitrogen: flow rate: 5 slm heat treatment temperature: 650° C.

heat treatment time: 30 sec

The second stage heat treatment is performed by RTA, to stabilize the titanium silicide layer 52.

The condition of the second stage heat treatment is as follows:

heat treatment atmosphere: nitrogen; flow rate: 5 slm heat treatment temperature: 750° C.

heat treatment time: 30 sec

The temperature of the second stage heat treatment may be set at a value of from 650° C. to 800° C.

After that, the non-reactant portion of titanium film 51 (shown by a two dot chain line) is selectively removed by wet etching using a solution of ammonia and hydrogen peroxide ($NH_4OH+H_2O_2$), to selectively form the titanium silicide layer 52 on the source/drain regions 19, 20, gate electrode 15, source/drain regions 39, 40, and gate electrode 35.

Figure 6D:
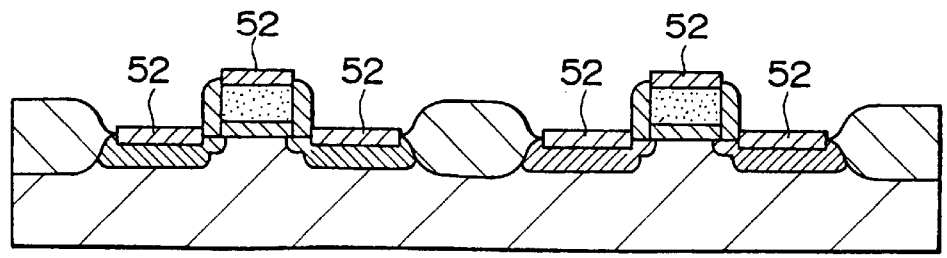
Figure 10A:
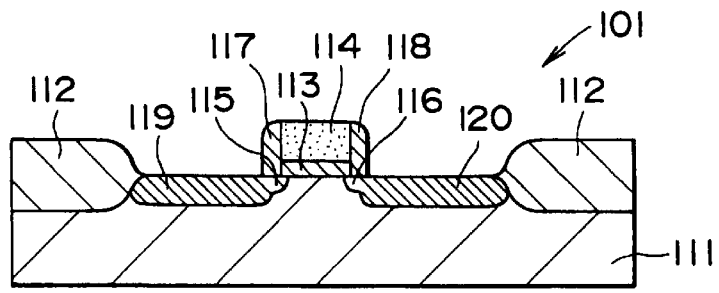
FIGS. 10A to 10C are views showing a sequence of steps of fabricating a semiconductor device according to a related art MOSLSI process.
Figure 10B:
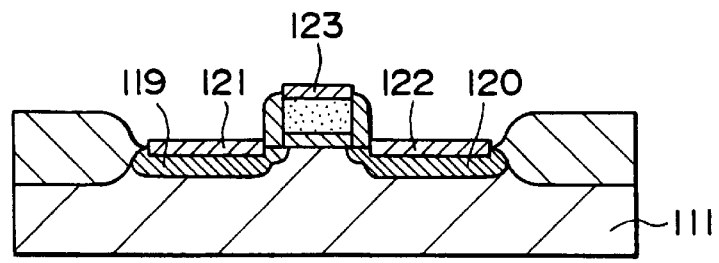
Figure 10C:
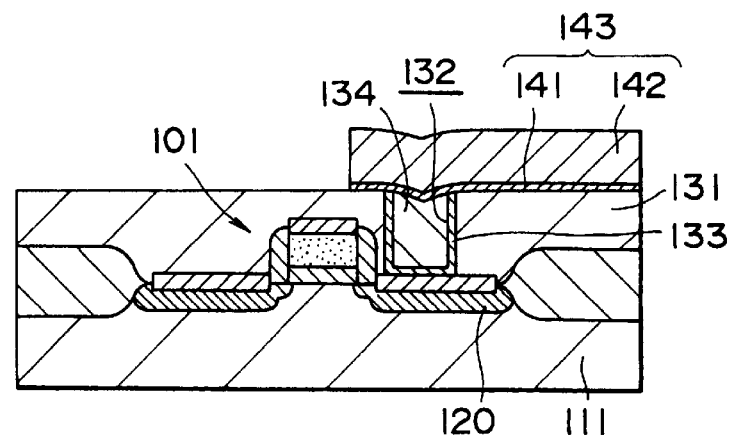
Figure 11:
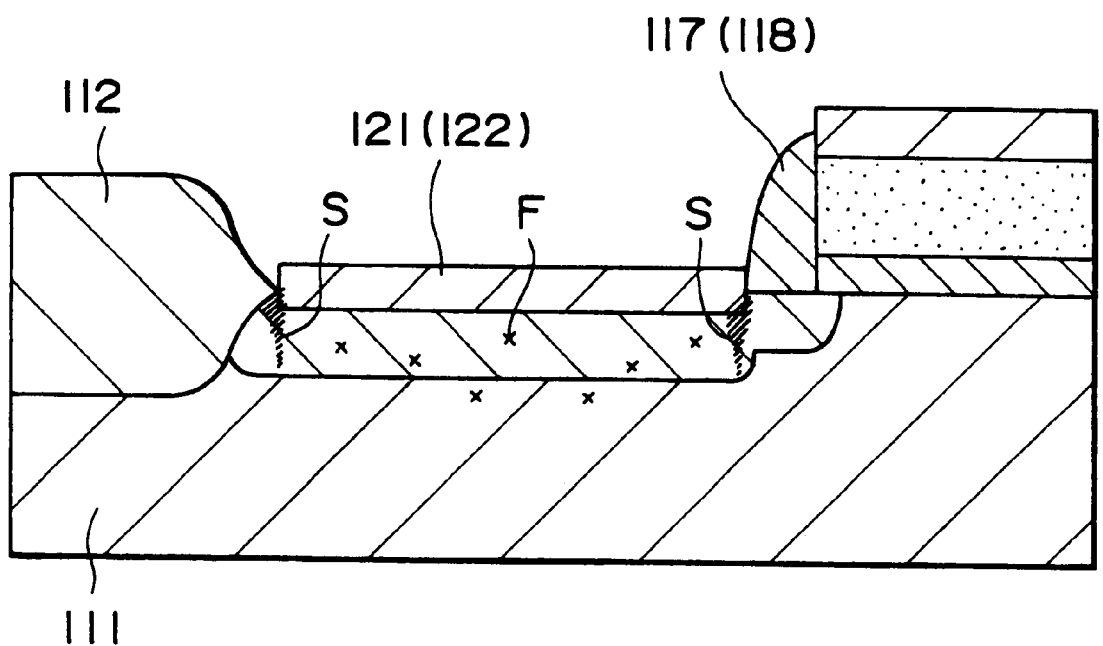
FIG. 11 is a view illustrating a problem of the related art process.

After that, as shown in FIG. 6D, a third stage heat treatment is performed by RTA to further stabilize the titanium silicide layer 52.

The condition of the third stage heat treatment is as follows:

heat treatment atmosphere: nitrogen; flow rate=5 slm heat treatment temperature: 800° C.

heat treatment time: 30 sec

In addition, the heat treatment temperature may be set at a value of from 750° C. to 900° C.

After that, the silicon substrate in such a state will be processed in accordance with the step of forming an interlayer insulating film and later steps, that is, in accordance with the steps described with reference to FIGS. 2A to 2C in the first embodiment.

In the process of the fifth embodiment, since the silicon substrate 11 is subjected to the above-described heat treatments, it is possible to relieve stresses exerting adverse effect on the silicon substrate 11, and hence to reduce junction leak current. In particular, it is possible to relieve stresses produced in the silicon substrate 11 at the ends of the side wall insulating films 18, 38 and at the ends of the element isolation region 12 formed of the LOCOS oxide film to a value less than the order of 1 GPa, and further to recover crystal defects produced in the silicon substrate 11 upon ion implantation.

In addition, the second heat treatment may be omitted.

Next, a sixth embodiment of the present invention will be described, which relates to a procedure of the activating heat treatment performed in each of the first to fifth embodiments. In addition, in this embodiment, parts corresponding to those described in the first embodiment are indicated by the same characters.

As described above, the activating heat treatment for the source/drain regions 19, 20, 39, 40 after formation thereof is performed by RTA (Rapid Thermal Annealing). In this RTA, the silicon substrate is heated at a specified temperature rising rate of from 1° C./sec to 50° C./sec at least in a temperature range of from a specified temperature lower than a temperature (600° C.) at which crystal strain is produced in the silicon substrate 11 to a heat treatment temperature (1000° C.); and after an elapse of a specified heat treatment time at the heat treatment temperature, it is cooled at a specified temperature dropping rate of from 1° C./sec to 50° C./sec at least in a temperature range of from the heat treatment temperature (1000° C.) to a specified temperature lower than the temperature (600° C.) at which crystal strain is produced in the silicon substrate 11.

The RTA having such a temperature chart is performed by a RTA apparatus using as a heat source a halogen lamp, mercury lamp, heating wire, infrared ray generator, or laser beam generator.

Next, examples of the above temperature chart of RTA will be described with reference to FIG. 7, in which the ordinate indicates the temperature and the abscissa indicates the time. In FIG. 7, with respect to each of lines A, B, the positive gradient thereof indicates a temperature rising rate and the negative gradient thereof indicates a temperature dropping rate.

In a first example shown by the solid line A of FIG. 7, the silicon substrate 11 is started to be heated to a heat treatment temperature (1000° C.) at a temperature rising rate of 10° C./sec, being kept at the heat treatment temperature (1000° C.) for a heat treatment time (for example, 10 sec), and is cooled from the heat treatment temperature (1000° C.) at a temperature dropping rate of 10° C./sec.

In a second example shown by the broken line B of FIG. 7, the silicon substrate 11 is started to be heated to a specified temperature (for example, 500° C.) lower than a temperature (600° C.) at which crystal strain is produced in the silicon substrate 11 at a temperature rising rate of 100° C./sec and is further heated to a heat treatment temperature (1000° C.) at a temperature rasing rate of 10° C./sec, being kept at the heat treatment temperature (1000° C.) for a heat treatment time (for example, 10 sec), and is cooled from the heat treatment temperature (1000° C.) to a specified temperature (for example, 500° C.) lower than the temperature at which crystal strain is produced in the silicon substrate 11 at a temperature dropping rate of 10° C./sec and is further cooled from the temperature (500° C.) at a temperature dropping rate of 100° C./sec.

In a related art temperature chart shown by a two dot chain line C of FIG. 7, the silicon substrate 11 is started to be heated to a heat treatment temperature (for example, 1000° C.) at a temperature rising rate of 100° C./sec, being kept at the heat treatment temperature (1000° C.) for a heat treatment time (for example, 10 sec), and is cooled from the heat treatment temperature (1000° C.) at a temperature dropping rate of 100° C./sec.

The temperature chart in the first example makes it possible to relieve stresses exerting adverse effect on the silicon substrate 11 and hence to reduce junction leak current, and particularly, to relieve stresses produced in the silicon substrate 11 at the ends of the side wall insulating films 18, 38 and at the ends of the element isolation region 12 formed of the LOCOS oxide film to a value less than the order of 1 GPa and also to recover crystal defects produced in the silicon substrate 11 upon ion implantation.

The temperature chart in the second example can exhibit the same effect as that of the temperature chart in the first example. Moreover, in the second example, since the above effect is not changed even when the silicon substrate is heated to the specified temperature lower than the temperature at which crystal strain is produced in the silicon substrate at the temperature rising rate of 100° C./sec, it is possible to shorten the heating time required for the silicon substrate to reach the heat treatment temperature. Similarly, in the second example, since the above effect is not changed even when the silicon substrate is cooled from the specified temperature lower than the temperature at which crystal strain is produced in the silicon substrate at the temperature dropping rate of 100° C./sec, it is possible to shorten the cooling time. This is because the relief of stresses and recovery of crystal defects are effective at a temperature over the temperature at which crystal strain is produced in the silicon substrate.

The temperature at which crystal strain is produced in the silicon substrate 11 will be described below.

The above crystal strain means a strain produced in the silicon crystal of the silicon substrate 11 due to a difference in thermal stress between the film (side wall insulating films 18, 38 in the sixth embodiment) formed on the surface of the silicon substrate 11 and the underlaying silicon substrate 11. The temperature at which the crystal strain is produced in the silicon substrate is about 600° C., depending on the concentration of an impurity contained in the silicon substrate 11 and the concentration of an impurity contained in the film (here, the side wall insulating films 18, 38) on the surface of the silicon substrate 11.

Accordingly, both a temperature from which the silicon substrate 11 is heated at a specified temperature rising rate of from 1° C./sec to 50° C./sec and a temperature to which the silicon substrate 11 is cooled at a specified temperature dropping rate of from 1° C./sec to 50° C./sec must be set to be lower than the temperature at which crystal strain is produced in the silicon substrate 11. In particular, unless a temperature to which the silicon substrate 11 is cooled at the above temperature dropping rate is set to be lower than the temperature at which crystal strain is produced in the silicon substrate 11, it becomes impossible to obtain a satisfactory heat treatment effect because of the crystal strain remaining in the silicon substrate 11.

Consequently, the temperature at which crystal strain is produced in the silicon substrate 11 is desirable to be set at about 500° C. in consideration of a temperature allowance. Of course, such a temperature is dependent on the concentration of an impurity contained in the silicon substrate 11.

The above crystal stain is increased as the silicon substrate 11 is heated up to a temperature range of from about 800° C. to about 900° C. (depending on the concentration of an impurity contained in the silicon substrate 11), and is relieved when the silicon substrate 11 is heated over the temperature range. Also, crystal defects produced in the silicon substrate 11 due to ion implantation of arsenic are recovered in the above temperature range.

On the other hand, the thermal stress due to the formation of the side wall insulating films 18, 38 is also desirable to be relieved, and the temperature required for relief of the thermal stress is in a range of from 700° C. to 900° C., depending on the concentration of an impurity contained in the side wall insulating films 18, 38.

Accordingly, the heat treatment temperature required for recovering crystal defects and relieving crystal strain due to a difference in thermal stress may be set in a range of from 900° C. to 1150° C., preferably, at 1000° C. in consideration of a temperature allowance to the lower limit. Of course, such a temperature is dependent on the concentration of an impurity contained in the silicon substrate 11 and the concentration of an impurity contained in the side wall insulating films 18, 38.

Additionally, the temperature chart described in the sixth embodiment can be applied to the activating heat treatment performed after formation of the contact holes 64, 65 followed by ion implantation described in the first embodiment.

Next, there will be described the sheet resistance of the source/drain region of the MIS (Metal Insulator Semiconductor) transistor formed in the process according to each of the first to fifth embodiments with reference to FIGS. 8A to 8B.

FIGS. 8A, 8B are graphs each showing a relationship between the sheet resistance of the source/drain region of the MIS transistor fabricated in the process described in the first embodiment and the width of the source/drain region; wherein FIG. 8A shows the sheet resistance of the P-type source/drain region (equivalent to the source/drain regions 19, 20 of FIGS. 1A to 1D); and FIG. 2 shows the sheet resistance of the N-type source/drain region (equivalent to the source/drain regions 39, 40 of FIG. 1). In these figures, the ordinate indicates the sheet resistance, and the abscissa indicates the width of the source/drain region in logarithm; and a mark ● indicates the sheet resistance of the MIS transistor fabricated in the inventive process, and a mark Δ indicates the sheet resistance of a MIS transistor fabricated in the related art process.

As shown in FIG. 8A, the sheet resistance of the P-type source/drain region (fine line portion) of the MIS transistor fabricated by the inventive process is lower than that of the P-type source/drain region of the MIS transistor fabricated by the related art process. In particular, the sheet resistance of the P-type source/drain region of the MIS transistor fabricated by the inventive process is not increases so much even when the width of the region becomes narrower. On the other hand, the sheet resistance of the P-type source/drain region of the MIS transistor fabricated by the related art process is rapidly increased when the width of the region becomes narrow to a value less than 1 μm.

As shown in FIG. 8B, the sheet resistance of the N-type source/drain region of the MIS transistor fabricated by the inventive process is not increased so much even when the width of the region becomes narrower. On the other hand, the sheet resistance of the N-type source/drain region of the MIS transistor fabricated by the related art process is rapidly increased when the width of the region becomes narrow to a value less than 2 μm.

The above-described result shows that the titanium silicide layer having a low resistance is formed in the source/drain region of the MIS transistor fabricated by the inventive process.

Accordingly, the fabrication process described in each of the first to fifth embodiments can provide a titanium silicide formation technology matched with devices having finer-line geometries of the order of 0.25 μm and the technology for forming MIS transistors using the titanium silicide formation technology, and particularly it makes it possible to form the titanium silicide layer 52 having a low resistance of 5 Ω/□ even on a finer region having a width of less than 0.25 μm, and hence to fabricate a MIS transistor excellent in operational performance.

Additionally, in the process of fabricating a MIS transistor according to the present invention, crystal defects liable to be produced in a silicon substrate at each end of a side wall insulating film formed on a side wall of a gate electrode can be recovered by repeating heat treatments several times so as to relieve stresses produced in the silicon substrate at the end of the side wall insulating film. This will be described with reference to FIG. 9.

FIG. 9 shows a change in junction leak current depending on the presence or absence of heat treatment, in which the ordinate indicates the presence or absence of heat treatment, and the abscissa indicates the junction leak current in logarithm.

From this figure, it is revealed that the junction leak current is significantly reduced by heat treatment, particularly, furnace heat treatment performed after formation of a side wall insulating film on a side wall of a gate electrode, with an effect of about one digit shown in FIG. 9.

In summary, it becomes apparent that the transistor exhibits a preferable junction leak characteristic by heat treatment.

Although the description has been made of titanium silicide in the first to fifth embodiments, the process of implanting ions of arsenic (As) after removal of an oxide film formed on the surface of the silicon substrate 11 can be applied to formation of a silicide layer made of cobalt silicide ($COSi_2$), zirconium silicide ($ZrSi_2$), hafnium silicide ($HfSi_2$), tungsten silicide ($WSi_2$), or nickel silicide ($NiSi_2$).

While the preferred embodiments of the present invention have been described using specific terms, such description is for illustrative purposes only, and it is to be understood that changes and variations may be made without departing from the spirit or scope of the following claims.

What is claimed is:

1. A method for making a semiconductor device comprising the steps of:
    forming a sidewall insulating film on a side portion of a gate electrode formed on a silicon substrate;
    performing a first furnace heat treatment of the substrate after forming the sidewall insulating film;
    forming a source/drain region in the substrate;
    subjecting the substrate to an activating heat treatment to activate impurities;
    performing a second furnace heat treatment of the substrate after the activating heat treatment;
    removing a native oxide film formed on the substrate;
    implanting arsenic ions into surface portions of the substrate to make them amorphous;
    forming a metal film on the surface of the source/drain region; and
    thereafter, reacting the metal film with the silicon substrate by heat treatment to form a silicide layer.

2. A process of fabricating a semiconductor device according to claim 1, wherein said first furnace heat treatment comprises a thermal oxidation treatment for forming an oxide film on the surface of said silicon substrate.

3. A process of fabricating a semiconductor device according to claim 1, wherein said step of making said metal film react with said silicon substrate thereby forming a silicide layer comprises a step of making said metal film react with said silicon substrate by a first stage heat treatment thereby forming a silicide layer, stabilizing said silicide layer by a second stage heat treatment, selectively removing a non-reactant portion of said metal film, and further stabilizing said silicide layer by a third stage heat treatment.

4. A process of fabricating a semiconductor device according to claim 1, wherein said activating heat treatment is a rapid thermal annealing performed in such a condition that
    a temperature rising rate at which said silicon substrate is heated up to a heat treatment temperature is in a range of from 1° C./sec to 50° C./sec in a temperature area from at least a specified temperature lower than a temperature at which crystal strain is produced in said silicon substrate to said heat treatment temperature; and
    a temperature dropping rate at which said silicon substrate is cooled from said heat treatment temperature is in a range of from 1° C./sec to 50° C./sec in a temperature area from at least said heat treatment temperature to a specified temperature lower than the temperature at which crystal strain is produced in said silicon substrate.

5. A method for making a semiconductor device comprising the steps of:
    forming a sidewall insulating film on a side portion of a gate electrode formed on a silicon substrate;
    performing a first furnace heat treatment of the substrate after forming the sidewall insulating film;
    forming a source/drain region in the substrate;
    subjecting the substrate to an activating heat treatment to activate impurities;
    removing a native oxide film formed on the substrate;
    implanting arsenic ions into surface portions of the substrate to make them amorphous;
    forming a metal film on the amorphous surface of the source/drain region;
    subjecting the metal film and silicon substrate to a first stage heat treatment to form a silicide layer;
    stabilizing the silicide layer by performing a second stage heat treatment;
    removing non-reactant portions of said metal film; and
    thereafter, further stabilizing the silicide layer by a third stage heat treatment.

6. A process of fabricating a semiconductor device according to claim 5, wherein a second furnace heat treatment is performed after formation of said source/drain region.

7. A process of fabricating a semiconductor device according to claim 5, wherein said activating heat treatment is a rapid thermal annealing performed in such a condition that
    a temperature rising rate at which said silicon substrate is heated up to a heat treatment temperature is in a range of from 1° C./sec to 50° C./sec in a temperature area from at least a specified temperature lower than a temperature at which crystal strain is produced in said silicon substrate to said heat treatment temperature; and
    a temperature dropping rate at which said silicon substrate is cooled from said heat treatment temperature is in a range of from 1° C./sec to 50° C./sec in a temperature area from at least said heat treatment temperature to a specified temperature lower than the temperature at which crystal strain is produced in said silicon substrate.

8. A method for making a semiconductor device comprising the steps of:
    forming a sidewall insulating film on a side portion of a gate electrode formed on a silicon substrate;
    performing a first furnace heat treatment of the substrate after forming the sidewall insulating film;
    forming a source/drain region in the substrate;
    performing a second furnace heat treatment of the substrate;
    subjecting the substrate to an activating heat treatment to activate impurities;
    removing a native oxide film formed on the substrate;
    implanting arsenic ions into surface portions of the substrate to make them amorphous;
    forming a metal film on the amorphous surface of the source/drain region;
    subjecting the metal film and silicon substrate to a first stage heat treatment to form a silicide layer;
    stabilizing the silicide layer by performing a second stage heat treatment;
    removing non-reactant portions of said metal film; and thereafter, further stabilizing the silicide layer by a third stage heat treatment.

9. A process of fabricating a semiconductor device according to claim 8, wherein said activating heat treatment is a rapid thermal annealing performed in such a condition that a temperature rising rate at which said silicon substrate is heated up to a heat treatment temperature is in a range of from 1° C./sec to 50° C./sec in a temperature area from at least a specified temperature lower than a temperature at which crystal strain is produced in said silicon substrate to said heat treatment temperature; and a temperature dropping rate at which said silicon substrate is cooled from said heat treatment temperature is in a range of from 1° C./sec to 50° C./sec in a temperature area from at least said heat treatment temperature to a specified temperature lower than the temperature at which crystal strain is produced in said silicon substrate.

* * * * *